United States Patent
Fujiwara et al.

(10) Patent No.: US 8,546,166 B2
(45) Date of Patent: Oct. 1, 2013

(54) III NITRIDE CRYSTAL SUBSTRATE, AND LIGHT-EMITTING DEVICE AND METHOD OF ITS MANUFACTURE

(75) Inventors: Shinsuke Fujiwara, Itami (JP); Hiroaki Yoshida, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 179 days.

(21) Appl. No.: 12/324,897

(22) Filed: Nov. 28, 2008

(65) Prior Publication Data

US 2009/0140287 A1 Jun. 4, 2009

(30) Foreign Application Priority Data

Nov. 30, 2007 (JP) .................. 2007-310725

(51) Int. Cl.
*H01L 21/00* (2006.01)
(52) U.S. Cl.
USPC ......... 438/47; 257/103; 257/79; 257/E29.089
(58) Field of Classification Search
USPC .............. 257/103, 79, E29.089; 438/47
See application file for complete search history.

(56) References Cited

U.S. PATENT DOCUMENTS

| | | | |
|---|---|---|---|
| 2003/0157376 A1* | 8/2003 | Vaudo et al. | 428/698 |
| 2003/0183157 A1* | 10/2003 | Usui et al. | 117/84 |
| 2004/0031978 A1* | 2/2004 | D'Evelyn et al. | 257/233 |

FOREIGN PATENT DOCUMENTS

| | | |
|---|---|---|
| CN | 1447448 A | 10/2003 |
| JP | 2000-349338 A | 12/2000 |
| JP | 2003-277195 A | 10/2003 |
| JP | 2007-161536 A | 6/2007 |
| WO | WO-2007-069388 A | 6/2007 |

OTHER PUBLICATIONS

Sergey Yu. Karpov et al., "Dislocation Effect on Light Emission Efficiency in Gallium Nitride," Applied Physics Letters, Dec. 16, 2002, pp. 4721-4723, vol. 81, No. 25, American Institute of Physics, NY.

Jeong Ho You et al., "Effect of Screw Dislocation Density on Optical Properties in n-Type Wurzite GaN," Journal of Applied Physics, Jan. 22, 2007, pp. 023516-1 to 023516-6, vol. 101, No. 2, American Institute of Physics, NY.

\* cited by examiner

*Primary Examiner* — Matthew Reames
(74) *Attorney, Agent, or Firm* — James W. Judge

(57) ABSTRACT

Toward making available III nitride crystal substrates advantageously employed in light-emitting devices, and light-emitting devices incorporating the substrates and methods of manufacturing the light-emitting devices, a III nitride crystal substrate has a major face whose surface area is not less than 10 cm$^2$ and, in a major-face principal region excluding the peripheral margin of the major face from its outer periphery to a 5 mm separation from its outer periphery, the total dislocation density is from $1\times10^4$ cm$^{-2}$ to $3\times10^6$ cm$^{-2}$, and the ratio of screw-dislocation density to the total dislocation density is 0.5 or greater.

6 Claims, 5 Drawing Sheets ium NITRIDE CRYSTAL SUBSTRATE, AND
LIGHT-EMITTING DEVICE AND METHOD
OF ITS MANUFACTURE

BACKGROUND OF THE INVENTION

1. Technical Field

The present invention relates to Group-III nitride crystal substrates advantageously employed in light-emitting devices, and to light-emitting devices and methods of their manufacture.

2. Description of the Related Art

Group III nitride crystal substrates find tremendous utility as substrates for a variety of semiconductor devices including optoelectronic device elements and electronic devices. Improving the characteristics of the variety of semiconductor devices in which III nitride crystal substrates are employed mandates that the substrates be of low dislocation density and favorable crystallinity. Furthermore, from a III nitride crystal substrate use-efficiency perspective, a substrate major-face surface area of 10 cm$^2$ or more, preferably 20 cm$^2$ or more, is deemed necessary.

Therefore, various techniques for fabricating low-dislocation-density III nitride crystal substrates in bulk have been proposed. (Cf., for example, Japanese Unexamined Pat. App. Pub. No. 2007-161536.)

Therein, Japanese Unexamined Pat. App. Pub. No. 2007-161536 discloses that electronic devices including an Al$_x$Ga$_y$In$_{1-x-y}$N (0≤x, 0≤y, x+y≤1) crystal substrate in which the total dislocation density is from $1 \times 10^2$ cm$^{-2}$ to $1 \times 10^6$ cm$^{-2}$, and an at least single-lamina semiconductor layer formed onto the substrate have uniform, high breakdown voltages. The document also discloses that from the perspective of heightening the device breakdown voltage, screw-dislocation density in the substrates for the electronic devices is preferably $1 \times 10^4$ cm$^{-2}$ or less.

Nevertheless, as to correlations between substrate dislocation density and the characteristics of semiconductor devices apart from electronic devices (light-emitting devices for example), Pat. App. Pub. No. 2007-161536 stops short of clarity.

BRIEF SUMMARY OF THE INVENTION

Accordingly, an object of the present invention is to clarify correlations between the dislocation density in III nitride crystal substrates and the characteristics of light-emitting devices, thereby making available III nitride crystal substrates advantageously employed in light-emitting devices, and light-emitting devices incorporating the substrates and methods of manufacturing the light-emitting devices.

The present invention in one aspect is a Group-III nitride crystal substrate having a major face whose surface area is 10 cm$^2$ or more, wherein, in a major-face principal region excluding the peripheral margin of the major face from its outer periphery to a 5 mm separation from its outer periphery, the total dislocation density is from $1 \times 10^4$ cm$^{-2}$ to $3 \times 10^6$ cm$^{-2}$, and the ratio of screw-dislocation density to the total dislocation density is 0.5 or greater. In a III nitride crystal substrate involving the present invention, the ratio of screw-dislocation density to the total dislocation density can be 0.9 or greater.

The present invention in another aspect is a light-emitting device including the above-described III nitride crystal substrate, and an at least single-lamina III nitride layer formed onto the III nitride crystal substrate.

The present invention in a still a further aspect is a light-emitting device manufacturing method including: a step of preparing the above-described III nitride crystal substrate; and a step of depositing an at least single-lamina III nitride layer onto the III nitride crystal substrate.

The present invention affords III nitride crystal substrates advantageously employed in light-emitting devices, and light-emitting devices incorporating the substrates and methods of manufacturing the light-emitting devices.

From the following detailed description in conjunction with the accompanying drawings, the foregoing and other objects, features, aspects and advantages of the present invention will become readily apparent to those skilled in the art.

FIG. 1A is a plan view representing a III nitride crystal substrate involving the present invention, wherein the inner border of a peripheral margin along the perimeter of the substrate is indicated by a dashed line.

BRIEF DESCRIPTION OF THE SEVERAL
VIEWS OF THE DRAWINGS

FIG. 3 is outline sectional views representing one example of a III-nitride crystal substrate manufacturing method, wherein

Figure 4A:
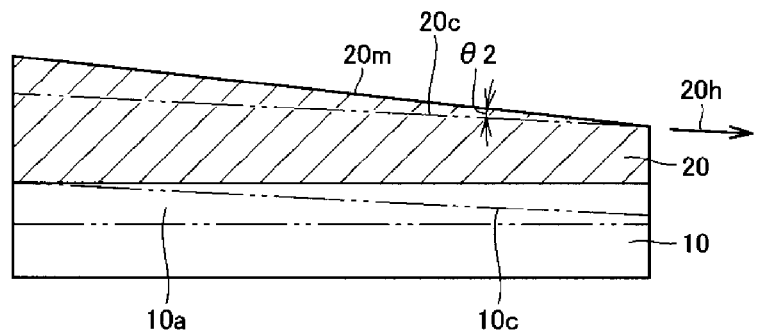
Figure 4B:
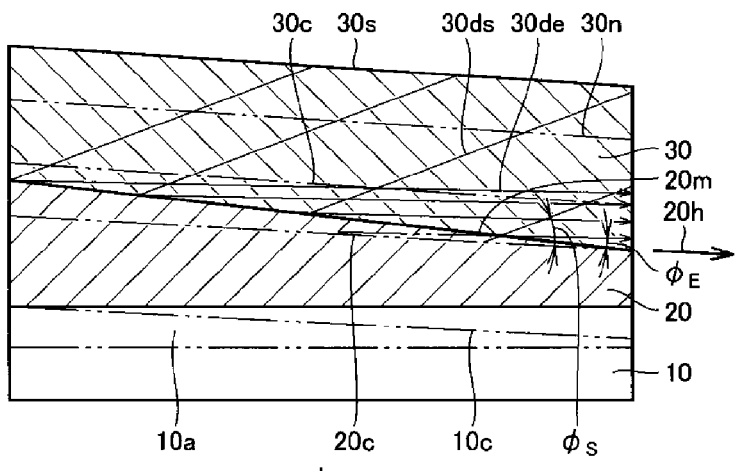
Figure 4C:
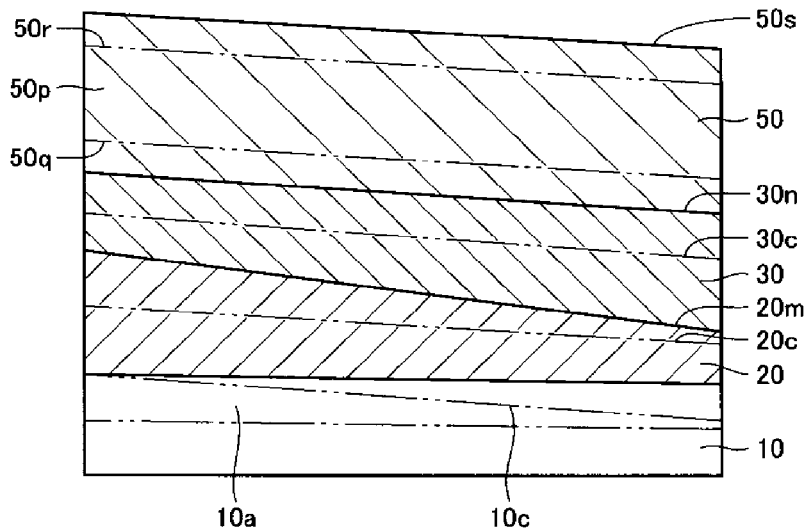

FIG. 4 is outline sectional views representing another example of a III-nitride crystal substrate manufacturing method, wherein FIG. 4A represents a step of forming a major face on a III nitride crystal grown by a liquid-phase technique, FIG. 4B represents a step of additionally growing a III nitride crystal by a liquid-phase technique, and FIG. 4C represents a step of additionally growing a III nitride crystal by a vapor-phase technique.

Figure 5:
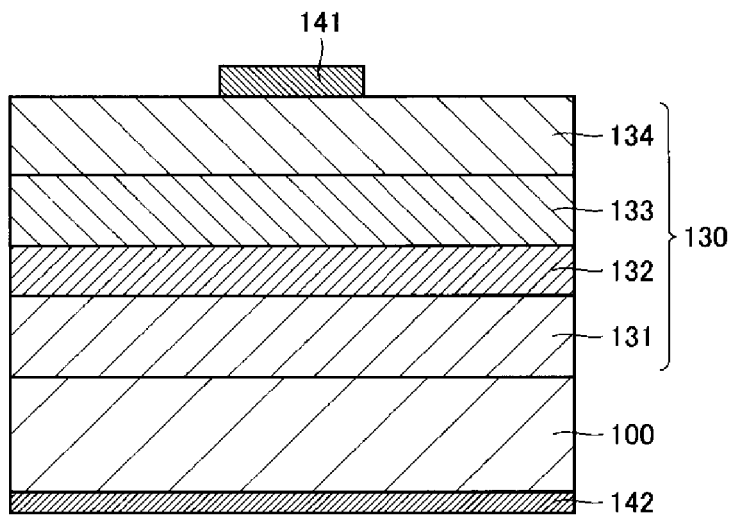

FIG. 5 is an outline sectional view of one example of a light-emitting device.

Figure 6:
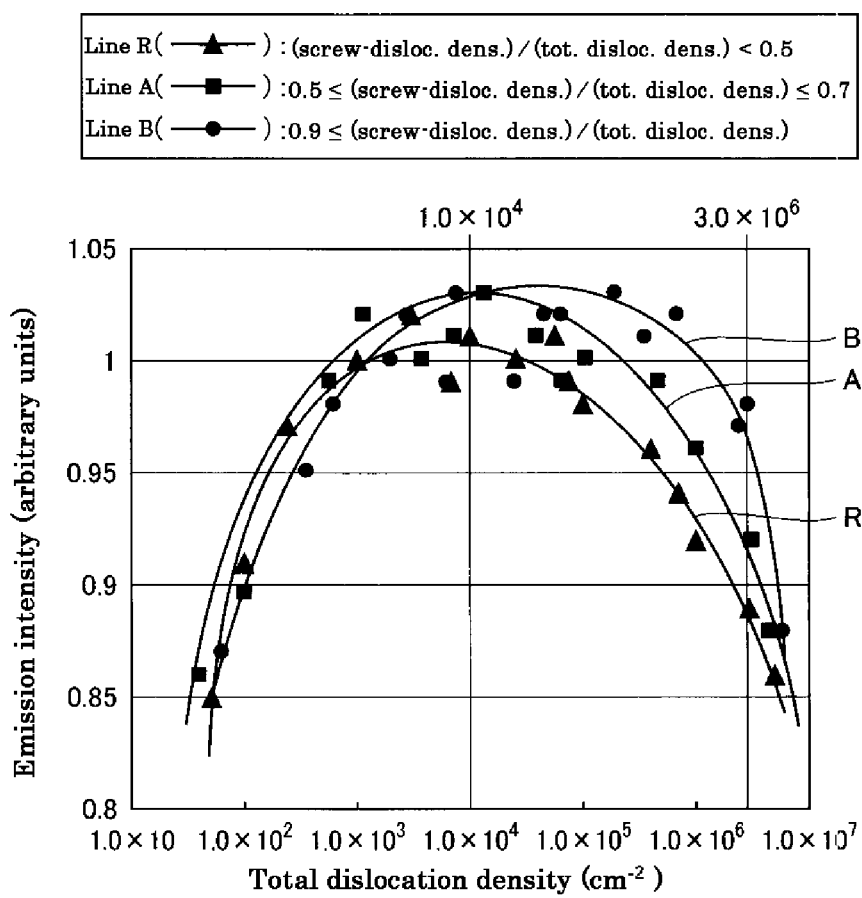

FIG. 6 is a graph plotting, for light-emitting devices on III-nitride crystal substrates, substrate total dislocation density, and the relationship between device emission intensity and the ratio of screw-dislocation density to the total dislocation density in the device substrates.

DETAILED DESCRIPTION OF THE INVENTION

Embodiment Mode 1

Figure 1A:
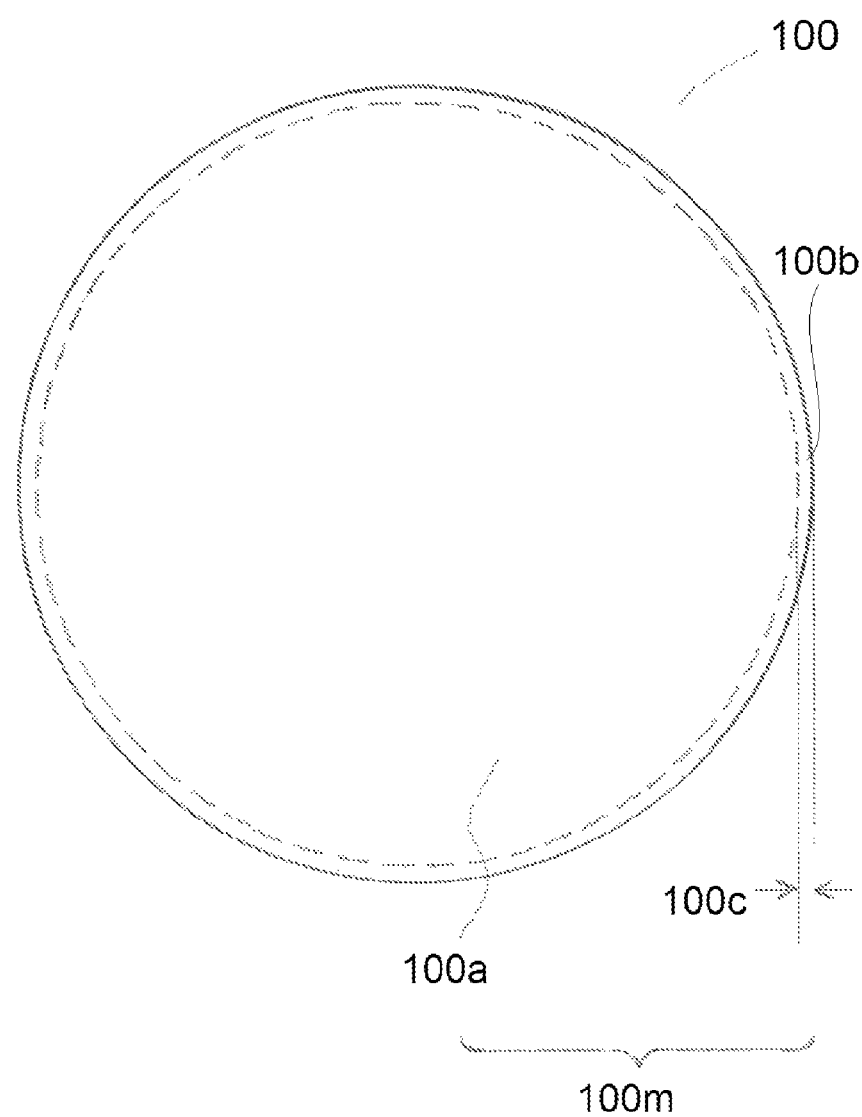
FIG. 1B is an outline fragmentary view representing a portion of the major face of the III nitride crystal substrate represented in FIG. 1A to depict etch pits having formed on the major face.

Reference is made to FIG. 1A. A III nitride crystal substrate 100 involving the present invention has a major face 100*m* whose surface area is 10 cm$^2$ or greater, with the total dislocation density being between $1 \times 10^4$ cm$^{-2}$ and $3 \times 10^6$ cm$^{-2}$ and with the ratio of screw-dislocation density to the total dislocation density being 0.5 or greater, in a major-face principal region 100*a* excluding the peripheral margin 100*b* of the major face from its outer periphery to a 5 mm separation 100*c* from its outer periphery.

A III nitride crystal substrate in the present embodiment mode has a major face whose surface area is 10 cm$^2$ or larger, which enables the manufacture of large-scale light-emitting devices, as well as the mass-production of light-emitting devices.

In a III nitride crystal substrate 100 in the present embodiment mode, the total dislocation density is between $1 \times 10^4$ cm$^{-2}$ and $3 \times 10^6$ cm$^{-2}$, with the ratio of screw-dislocation density to the total dislocation density being 0.5 or greater, in a principal region 100a of the major face 100m, excepting the peripheral margin 100b of the major face from its outer periphery to a 5 mm separation 100c therefrom. Referring to FIG. 6, as will be detailed later, light-emitting devices with an at least single-lamina III nitride layer formed onto a III nitride crystal substrate in which the total dislocation density is between $1 \times 10^4$ cm$^{-2}$ and $3 \times 10^6$ cm$^{-2}$, and the ratio of screw-dislocation density to the total dislocation density is 0.5 or greater have higher emission intensities by comparison with light-emitting devices with an at least single-lamina III nitride layer formed onto a III nitride crystal substrate in which the total dislocation density is between $1 \times 10^4$ cm$^{-2}$ and $3 \times 10^6$ cm$^{-2}$, and the ratio of screw-dislocation density to the total dislocation density is less than 0.5.

In a III nitride crystal substrate in a further aspect of the present embodiment mode, the total dislocation density is between $1 \times 10^4$ cm$^{-2}$ and $3 \times 10^6$ cm$^{-2}$, with the ratio of screw-dislocation density to the total dislocation density being 0.9 or greater, in the principal region 100a of the major face 100m excepting the peripheral margin 100b of the major face from its outer periphery to a 5 mm separation 100c therefrom. Referring again to FIG. 6, light-emitting devices with an at least single-lamina III nitride layer formed onto a III nitride crystal substrate in which the total dislocation density is between $1 \times 10^4$ cm$^{-2}$ and $3 \times 10^6$ cm$^{-2}$, and the ratio of screw-dislocation density to the total dislocation density is 0.9 or more have still higher emission intensities by comparison with light-emitting devices with an at least single-lamina III nitride layer formed onto a III nitride crystal substrate in which the total dislocation density is between $1 \times 10^4$ cm$^{-2}$ and $3 \times 10^6$ cm$^{-2}$ and the ratio of screw-dislocation density to the total dislocation density is from 0.5 to 0.7.

Herein, the reason evaluation of the total dislocation density and the ratio of screw-dislocation density to the total dislocation density are carried out in the major-face principal region 100a that excludes the peripheral margin 100b of the major face 100m from its outer periphery to a 5 mm separation 100c from its outer periphery is because it can happen that dislocations swept out to the outer periphery gather in the peripheral margin 100b raising the dislocation density.

The present inventors had previously found that semiconductor devices formed employing III nitride crystal substrates in which the total dislocation density is between $1 \times 10^2$ cm$^{-2}$ and $1 \times 10^6$ cm$^{-2}$ have advanced characteristics by comparison with semiconductor devices formed in the same structure as that of the above semiconductor devices, employing III nitride crystal substrates in which the total dislocation density is less than $1 \times 10^2$ cm$^{-2}$ (cf. Japanese Unexamined Pat. App. Pub. No. 2007-161536). The present inventors completed the present invention by further discovering that with the total dislocation density being between $1 \times 10^4$ cm$^{-2}$ and $3 \times 10^6$ cm$^{-2}$, light-emitting devices formed employing III nitride crystal substrates in which the ratio of screw-dislocation density to the total dislocation density is 0.5 or greater exhibit higher emission intensities by comparison with light-emitting devices formed employing III nitride crystal substrates in which the ratio of screw-dislocation density to the total dislocation density is less than 0.5.

Dislocations that can appear on the major face of a III nitride crystal substrate include screw dislocations, edge dislocations, and mixed dislocations in which screw and edge dislocations are intermingled. Furthermore, by etching the major face of a substrate, dislocations appearing on the substrate major face can be verified as the pits produced ("etch pits" hereinafter).

The method of etching the major face of a III nitride crystal substrate is not particularly limited; either liquid-phase etching or vapor-phase etching may be adopted. In liquid-phase etching, etching solutions preferably employed include a eutectic mixture of potassium hydrate and sodium hydrate (KOH—NaOH eutectic mixture) at a solution temperature of some 300° C. to 500° C., or a solution mixture of phosphoric acid and sulfuric acid ($H_3PO_4$—$H_2SO_4$ solution mixture) at a temperature of some 200° C. to 300° C. In vapor-phase etching, etching gases containing halogen gases or halogen compound gases are preferably employed. As a halogen gas contained in the etching gas, $Cl_2$ gases or $F_2$ gases, and as a halogen compound gas, HCl gases, $BCl_3$ gases or $CF_4$ gases, may be given as preferable examples. Herein, from the perspective of enabling the etching a large amount of crystals at once, and of facilitating post-etch cleaning operations, vapor-phase etching is more preferable.

Figure 1B:
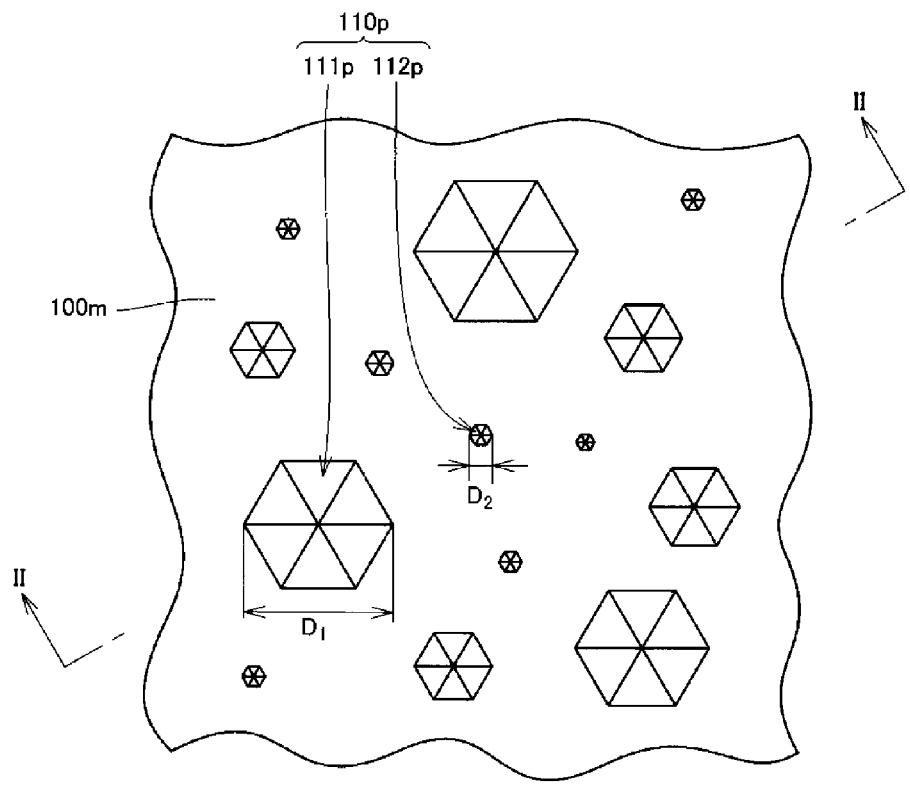
Figure 2:
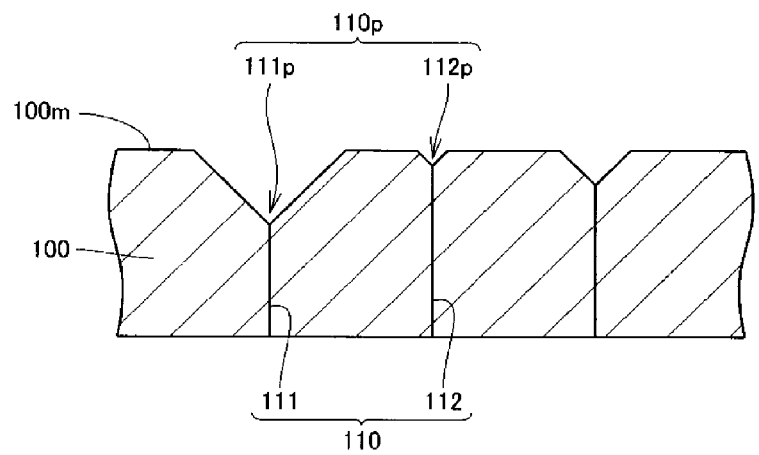
FIG. 2 is an outline sectional view taken along the line II-II in FIG. 1, seen in the direction of the arrows.

Referring to FIGS. 1 and 2, if a major face 100m of a III nitride crystal substrate 100 is etched, etch pits 110p corresponding to dislocations 110 appearing on the major face 100m form. The etch pits 110p are in the form of hexagonal pyramids whose opposing basal edges are nearly parallel to each other, and for the most part are in the form of regular hexagonal pyramids. Herein, the average distance between opposite basal corners of the hexagonal pyramids that are the etch pits 110p is defined as the diameter of an etch pit.

The type of the dislocations 110 can be distinguished by the size of the etch pit 110p diameter. Etch pits 111p (referred to as large etch pits 111p hereinafter) having a greater diameter $D_1$ are based on screw dislocations 111, while etch pits 112p (referred to as small etch pits 112p hereinafter) having a shorter diameter $D_2$ are based on edge dislocations 112. Specifically, dislocations are classified into three types: screw dislocation, edge dislocation, and mixed dislocation in which the screw and edge dislocations are intermingled. It should be understood that "screw dislocations" in the present invention refers to dislocations that contain screw dislocations, and includes screw dislocations and mixed dislocations.

The absolute value of the diameter of each etch pit varies depending on the conditions for etching the major face of a substrate, but the relative ratio between the diameters of the large and small etch pits, not being dependent on the etching conditions, is nearly constant. Furthermore, variations occur both in the diameter $D_1$ of the large etch pits 111p and in the diameter $D_2$ of the small etch pits 112p, and such that the ratio $D_1:D_2$ is approximately 5~10:1~2.

In the present application, "dislocations" signifies either the aforementioned screw dislocations (that is, screw dislocations and mixed dislocations are included in the detailed definition) or edge dislocations, and "total dislocations" signifies all the dislocations, including the aforementioned screw dislocations and edge dislocations. Accordingly, "total dislocation density" is density of the total dislocations per unit area, and is calculated by counting the total number of great and small etch pits per unit area. Furthermore, "screw-dislocation density" is the density of screw dislocations per unit area, and is calculated by counting the number of large etch pits per unit area.

Figure 3A:
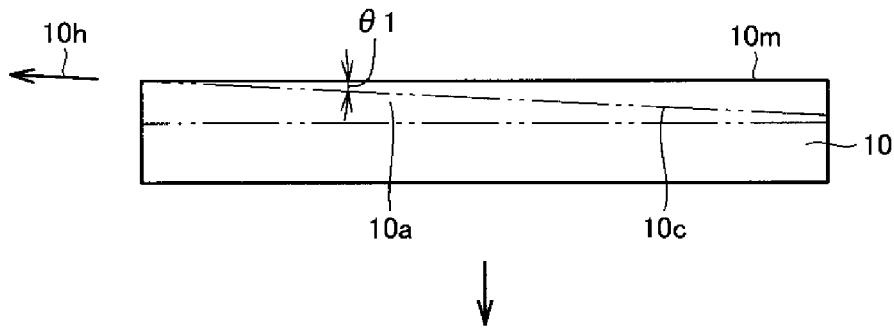
FIG. 3A represents a step of preparing an undersubstrate.

The method of manufacturing a III nitride crystal substrate in the present embodiment mode is not particularly limited; the substrate may be manufactured by, for example, the following method. First, referring to FIG. 3A, an undersubstrate 10 including a III nitride crystal layer 10a having a major face 10m, with the major face 10m having an angle of inclination $\theta_1$ of from 0.50 to 10° with respect to a {0001} plane 10c of the III nitride crystal layer 10a is prepared (step of preparing an undersubstrate).

Figure 3B:
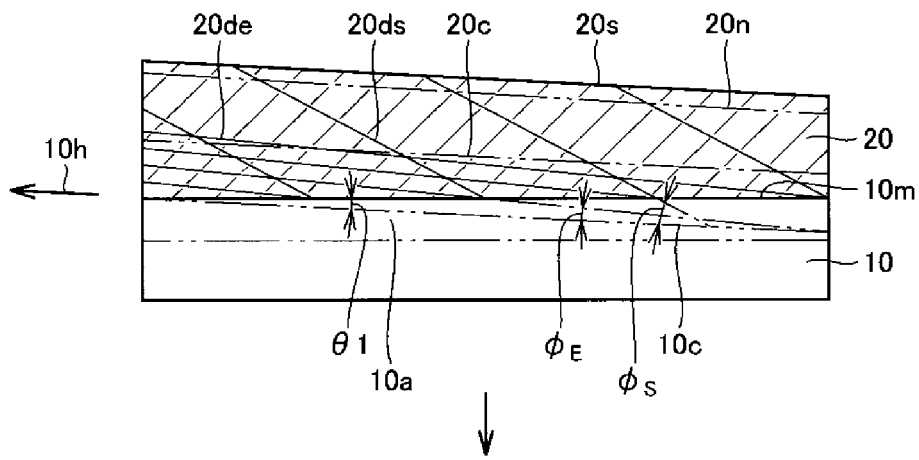
FIG. 3B represents a step of growing a III nitride crystal by a liquid-phase technique.

Next, referring to FIG. 3B, a III nitride crystal 20 is grown onto the major face 10m of the undersubstrate 10 by a liquid-phase technique (step of growing a III nitride crystal). Herein, the liquid-phase technique is not particularly limited, but from the perspective of epitaxially growing low-dislocation-density crystals efficiently, a method in which the undersubstrate is arranged so that its major face contacts with a melt containing a Group III elemental metal, and a nitrogen-containing gas (such as gaseous nitrogen) is supplied to the melt, to grow a III nitride crystal onto the major face of the undersubstrate is preferable. The melt is not particularly limited as long as it contains a III-elemental metal; a molten Group-III metal (solution or self-flux technique), or a melt (flux technique) of a III-elemental metal and a metal (such as Na, Li and other alkali metals, Ca and other alkali earth metals, and Cu, Ti, Fe, Mn, Cr and other transition metals) serving as a solvent for the III elemental-metal is utilized, for example.

On the major face 10m of the undersubstrate 10, a plurality of (not-illustrated) micro-steps consisting of a plurality of (not-illustrated) terraced faces paralleling a {0001} plane 10c, and of a plurality of (not-illustrated) stepped planes having a given angle with respect to the {0001 } plane are formed.

Growing the III nitride crystal 20 onto the major face 10m by a liquid-phase technique leads to crystal growth in the direction parallel to, and in the direction perpendicular to, the terraced faces. Furthermore, the crystal-growth rate in the direction parallel to the terraced faces is more rapid by comparison with the crystal-growth rate in the direction perpendicular to the terraced faces. Herein, edge dislocations propagate parallel to the crystal growth direction. The edge dislocations therefore propagate substantially paralleling the terraced faces. That is, the dislocation propagation angle $\phi_E$ formed by the edge-dislocation propagation line 20de and the {0001} planes 10c and 20c is small, being some 0° to 5°. In contrast, screw dislocations propagate in a direction having an angle of inclination of 30° to 45° with respect to the crystal growth direction. That is, the dislocation propagation angle $\phi_S$ formed by the screw-dislocation propagation line 20ds and the {0001 } planes 10c and 20c is large, being some 45° to 60°.

Accordingly, employing the above undersubstrate 10 results in that compared with screw dislocations, edge dislocations are more efficiently swept out to the outer periphery of crystal, reducing total dislocation density, and heightening ratio of screw-dislocation density to the total dislocation density.

Herein, how dislocations in crystal are transmitted (dislocation transmitting lines 20de and 20ds) can be observed by light-scattering tomography. Furthermore, the {hklm} planes and <hklm> directions in crystal can be identified by X-ray diffraction. It will be appreciated that the {hklm} planes (herein h, k, l and m are Miller indexes, ditto hereinafter) are a generic term for the planes including the (hklm) plane and planes crystallographically equivalent to the (hklm) plane. Likewise, the <hklm> directions are a generic term for the directions including the [hklm] direction and the directions crystallographically equivalent to the [hklm] direction.

Here, from the perspective of crystal symmetry, the tilt vector 10h of the major face 10m of the undersubstrate 10 is preferably inclined in a <1-100> direction or in a <11-20> direction with respect to a <0001> direction.

Furthermore, referring to FIG. 3B, the surface 20s of the III nitride crystal 20 grown by a liquid-phase technique in the above manner is planarized by grinding or polishing to form a major face 20n paralleling the {0001} planes 10c and 20c.

Figure 3C:
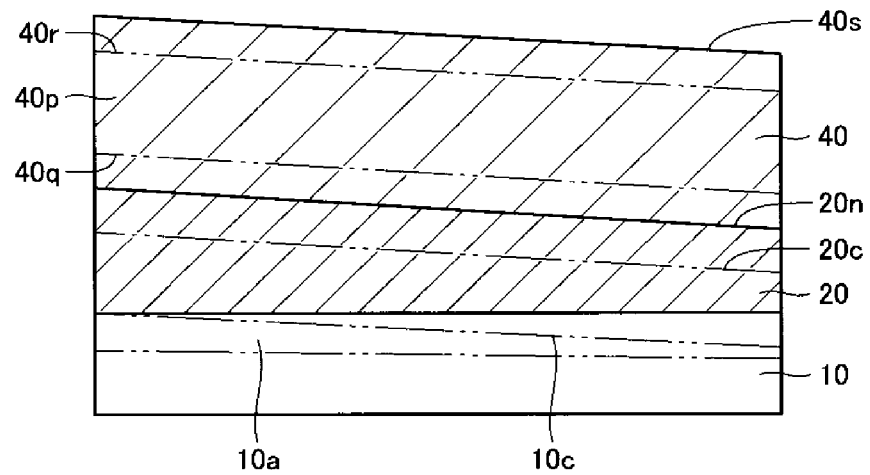
FIG. 3C represents a step of additionally growing a III nitride crystal by a vapor-phase technique.

Next, referring to FIG. 3C, a III nitride crystal 40 may be additionally grown onto the major face 20n of the III nitride crystal 20 by a vapor-phase technique. The vapor-phase technique is not particularly limited, but from the perspective of epitaxially growing low-dislocation-density crystals efficiently, preferable techniques include hydride vapor phase epitaxy (HVPE), metalorganic chemical vapor deposition (MOCVD), and molecular beam epitaxy (MBE). Among these techniques, from the perspective of rapid crystal-growth rate in particular, HVPE is preferable. That is, additionally growing by HVPE the III nitride crystal 40 onto the major face 20n of the III nitride crystal 20 enables reducing total dislocation density and screw-dislocation density in the III nitride crystal 40 as it grows. Herein, in the growth of the III nitride crystal 40, the ratio between edge-dislocation density and screw-dislocation density only slightly varies because the extent of the dislocation reduction with the growth is small. In other words, ratio of screw-dislocation density to total dislocation density also only slightly varies.

Herein, as illustrated in FIG. 3C, the III nitride crystal 40 is sliced in a plurality of planes 40q and 40r paralleling the {0001} planes 10c and 20c, and the cut surfaces are planarized by grinding or polishing, to produce a large number of III nitride crystal substrates 40p in which dislocation density has been reduced.

Furthermore, referring to FIG. 4A, the surface of the III nitride crystal 20 grown by a liquid-phase technique is ground or polished to form a major face 20m having an angle of inclination $\theta_2$ of from 0.5° to 10° with respect to the {0001 } planes 10c and 20c.

Next, referring to FIG. 4B, a III nitride crystal 30 may be additionally grown onto the major face 20m of the III nitride crystal 20 by a liquid-phase technique. The liquid-phase technique is not particularly limited, but from the perspective of growing epitaxially low-dislocation-density crystal efficiently, a method in which an undersubstrate is arranged so that its major face contacts with a melt containing a III-elemental metal, and a nitrogen-containing gas (such as a nitrogen gas) is supplied to the melt, to grow a III nitride crystal onto the major face of the undersubstrate—for example, solution or flux technique—is preferable. Herein, on the major face 20m of the III nitride crystal 20, owing to the angle of inclination $\theta_2$ with respect to the {0001} planes 10c and 20c, as on the major face 10m of the undersubstrate 10, a plurality of (not-illustrated) micro-steps consisting of a plurality of (not-illustrated) terraced faces paralleling the {0001 } planes 10c and 20c, and of a plurality of (not-illustrated) stepped planes having a given angle with respect to a {0001} plane form.

Growing the III nitride crystal 30 onto the major face 20m by a liquid-phase technique leads to crystal growth in the direction parallel to, and in the direction perpendicular to, the terraced faces. Furthermore, crystal-growth rate in the direction parallel to the terraced faces is more rapid by comparison with crystal-growth rate in the direction perpendicular to the terraced faces. Herein, edge dislocations propagate parallel to the crystal growth direction. The edge dislocations therefore propagate substantially paralleling the terraced faces. That is, the dislocation propagation angle $\phi_E$ formed by the edge-dislocation propagation line 20de and the {0001} planes 10c and 20c is small, being some 0° to 5°. In contrast, screw dislocations propagate in a direction having an angle of inclination of 30° to 45° with respect to the crystal growth direction. That is, the dislocation propagation angle $\phi_S$ formed by the screw-dislocation propagation line 20ds and the {0001} planes 10c and 20c is large, being some 45° to 60°.

Accordingly, additionally growing the III nitride crystal 30 onto the major face 20m of the III nitride crystal 20 by liquid-phase technique results in that edge dislocations are more efficiently swept out to the outer periphery of crystal by comparison with screw dislocations. Therefore, in the III nitride crystal 30 by comparison with in the III nitride crystal 20, total dislocation density is further reduced, and the ratio of screw-dislocation density to the total dislocation density is made greater.

Here, from the perspective of crystal symmetry, the tilt vector 20h of the major face 20m of the III nitride crystal 20 is preferably inclined in a <1-100> direction or in a <11-20> direction with respect to a <0001> direction. Moreover, from the perspective of further reducing the total dislocation density, and of making the ratio of screw-dislocation density to the total dislocation density greater, the tilt vector 20h of the major face 20m of the III nitride crystal 20 more preferably differs in orientation from the tilt vector 10h of the major face 10m of the undersubstrate 10.

As just described, repeating the formation, onto a grown III nitride crystal, of a major face having an angle of inclination of 0.5° to 10° with respect to a {0001} plane, and the growth of a III nitride crystal onto the major face by a liquid-phase technique enables reducing further total dislocation density, and making the ratio of screw-dislocation density to the total dislocation density greater.

Moreover, referring to FIG. 4B, the surface 30s of the III nitride crystal 30 grown by a liquid-phase technique in the above manner is planarized by grinding or polishing to form a major face 30n paralleling the {0001} planes 10c and 20c.

Next, referring to FIG. 4C, a III nitride crystal 50 may be additionally grown onto the principal surface 30n of the III nitride crystal 30 by a vapor-phase technique. The vapor-phase technique is not particularly limited, but from the perspective of epitaxially growing low-dislocation-density crystals efficiently, preferable techniques include HVPE, MOCVD, and MBE. Among these techniques, from the perspective of rapid crystal-growth rate, HVPE is particularly preferable. That is, additionally growing by HVPE the III nitride crystal 50 onto the major face 30n of the III nitride crystal 30 makes it possible to reduce the total dislocation density and screw-dislocation density in the III nitride crystal 50 as it grows. Herein, in the growth of the III nitride crystal 50, the ratio between edge-dislocation density and screw-dislocation density only slightly varies because the extent of the dislocation reduction with the growth is small. In other words, the ratio of screw-dislocation density to the total dislocation density also only slightly varies.

Herein, as illustrated in FIG. 4C, the III nitride crystal 50 is sliced in a plurality of planes 50q and 50r parallel to {0001} planes 10c, 20c and 30c, and the cut surfaces are planarized by grinding or polishing, to produce a large number of III nitride crystal substrates 50p in which the dislocation density has been lowered.

Accordingly, appropriately combining the above crystal growth methods lowers total dislocation density, and heightens ratio of screw-dislocation density to the total dislocation density by comparison with an undersubstrate or a III nitride crystal serving as the undersubstrate, leading to III nitride crystals and III nitride crystal substrates in which the total dislocation density is between $1 \times 10^4$ cm$^{-2}$ and $3 \times 10^6$ cm$^{-2}$, with the ratio of screw-dislocation density to the total dislocation density being 0.5 or greater.

Embodiment Mode 2

Referring to FIG. 5, a light-emitting device involving the present invention includes a III nitride crystal substrate 100 in Embodiment Mode 1, and an at least single-lamina III nitride layer 130 formed onto the III nitride crystal substrate 100. A light-emitting device in the present embodiment mode includes an at least single-lamina III nitride layer formed onto a III nitride crystal substrate in which the total dislocation density is between $1 \times 10^4$ cm$^{-2}$ and $3 \times 10^6$ cm$^{-2}$, with the ratio of screw-dislocation density to the total dislocation density being 0.5 or greater. Therefore, the device has high emission intensity, as shown in FIG. 6.

Specifically, referring to FIG. 5, in the light-emitting device in the present embodiment mode, as an at least single-lamina III nitride layer 130, onto a first major face of a GaN substrate (III nitride crystal substrate 100) of 1 mm×1 mm×500 μm in thickness, in which the total dislocation density is between $1 \times 10^4$ cm$^{-2}$ and $3 \times 10^6$ cm$^{-2}$, with the ratio of screw-dislocation density to the total dislocation density being 0.5 or greater, the following layers are successively deposited: a 2 μm-thick n-type GaN layer 131 doped with Si; a 100 nm-thick emission layer 132 having a multiquantum well structure constituted by six pairs of an $In_{0.01}Ga_{0.99}N$ barrier layer and an $In_{0.1}Ga_{0.9}N$ well layer; a 20 nm-thick p-type $Al_{0.18}Ga_{0.82}N$ layer 133 doped with Mg; and a 50 nm-thick p-type GaN layer 134 doped with Mg. Furthermore, a Ni/Au electrode of 0.2 mm×0.2 mm×0.5 μm in thickness, serving as a p-side electrode 141 is formed onto a part of the p-type GaN layer 134. Moreover, a 1 μm-thick Ti/Al electrode serving as an n-side electrode 142 is formed onto a second major face of the GaN substrate (III nitride crystal substrate 100).

Embodiment Mode 3

Referring to FIG. 5, one embodiment mode of a light-emitting device manufacturing method involving the present invention includes a step of preparing a III nitride crystal substrate 100 in Embodiment Mode 1, and a step of forming an at least single-lamina III nitride layer 130 onto the III nitride crystal substrate 100. According to the light-emitting device manufacturing method in the present embodiment mode, forming the at least single-lamina III nitride layer 130 onto the III nitride crystal substrate 100 in which the total dislocation density is between $1 \times 10^4$ cm$^{-2}$ and $3 \times 10^6$ cm$^{-2}$, with the ratio of screw-dislocation density to the total dislocation density being 0.5 or greater makes it possible to manufacture light-emitting devices having high emission intensity.

The light-emitting device manufacturing method in the present embodiment mode is provided with the step of preparing the III nitride crystal substrate 100 in Embodiment Mode 1. The step of preparing a III nitride crystal substrate in which the total dislocation density is between $1 \times 10^4$ cm$^{-2}$ and $3 \times 10^6$ cm$^{-2}$, with the ratio of screw-dislocation density to the total dislocation density being 0.5 or greater is not particularly limited, but from the perspective of efficiently manufacturing the substrates, the preparation is preferably carried out by the method described in Embodiment Mode 1.

The light-emitting device manufacturing method in the present embodiment mode is additionally provided with the step of forming the at least single-lamina III nitride layer 130 onto the III nitride crystal substrate 100. The method of forming a III nitride layer is not particularly limited, but from the perspective of growing low-dislocation-density epitaxial layers, techniques preferably employed include HVPE, MOCVD, and MBE. From the perspective of being high in productivity and reliability, MOCVD is more preferably employed.

In the step of forming the at least single-lamina III nitride layer 130 onto the III nitride crystal substrate 100, onto a first major face of a GaN substrate of 50.8 mm (2 inches) in diameter×500 μm in thickness, serving as a III nitride crystal substrate 100, the following layers are successively grown by, for example, MOCVD: a 2 μm-thick n-type GaN layer 131 doped with Si; a 100 nm-thick emission layer 132 having a multiquantum well structure constituted by six pairs of an $In_{0.01}Ga_{0.99}N$ barrier layer and an $In_{0.1}Ga_{0.9}N$ well layer; a 20 nm-thick p-type $Al_{0.18}Ga_{0.82}N$ layer 133 doped with Mg; and a 50 nm-thick p-type GaN layer 134 doped with Mg.

Furthermore, onto a part of the p-type GaN layer 134, a 0.5 μm-thick Ni/Au electrode serving as a p-side electrode 141 is formed by (vacuum) evaporation. Likewise, onto a second major face of the GaN substrate (III nitride crystal substrate 100), a 1 μm-thick Ti/Al electrode serving as an n-side electrode 142 is formed by evaporation.

Next, wafers in which the at least single-lamina III nitride layer 130 is formed onto the III nitride crystal substrate 100 are divided into chips of the predetermined size to manufacture light-emitting devices of the predetermined size.

Embodiments

Embodiment 1

1. III-Nitride Crystal Substrate Preparation

A GaN undersubstrate of 50.8 mm (2 inches) in diameter× 500 μm in thickness, having a major face having an angle of inclination of 5° with respect to the (0001) plane, with the total dislocation density being $1 \times 10^7$ $cm^{-2}$, and with the ratio of screw-dislocation density to the total dislocation density being 0.1 was employed to grow, by combining the solution technique (liquid-phase technique) described in Embodiment Mode 1 with HVPE (vapor-phase technique), a plurality of GaN crystals having, with total dislocation densities ranging from $5 \times 10$ $cm^{-2}$ to $5 \times 10^6$ $cm^{-2}$, ratios of screw-dislocation density to total dislocation density; and GaN substrates that were each 50.8 mm (2 inches) in diameter×500 μm in thickness were fabricated from these GaN crystals. Herein, as to the GaN crystal growth conditions in the flux method, the temperature of molten Ga was brought to 1000° C., and the $N_2$ gas pressure was brought to 10 MPa. Furthermore, in conditions for growing the GaN crystals by HVPE, partial pressure of a Ga chloride gas was brought to 10 kPa, partial pressure of a $NH_3$ gas was brought to 100 kPa, and the crystal growth temperature was made 1100° C.

The plurality of fabricated GaN substrates were classified into three groups: a group ("Group R" hereinafter) consisting of a plurality of GaN substrates in which the ratio of screw-dislocation density to the total dislocation density was less than 0.5; a group ("Group A" hereinafter) consisting of a plurality of GaN substrates in which the ratio of screw-dislocation density to the total dislocation density was between 0.5 and 0.7; and a group ("Group B" hereinafter) consisting of a plurality of GaN substrates in which the ratio of screw-dislocation density to the total dislocation density was 0.9 or more.

2. Light-Emitting Device Formation

Next, as an at least single-lamina III nitride layer 130, onto a first major face of the plurality of GaN substrates (III nitride crystal substrates 100) of 50.8 mm (2 inches) in diameter×500 μm in thickness in each of the groups, the following layers were successively grown by MOCVD: a 2 μm-thick n-type GaN layer 131 (carrier concentration: $2 \times 10^{18}$ $cm^{-3}$) doped with Si; a 100 nm-thick emission layer 132 having a multiquantum well structure constituted of six pairs of an $In_{0.01}Ga_{0.99}N$ barrier layer and an $In_{0.1}Ga_{0.9}N$ well layer; a 20 nm-thick p-type $Al_{0.18}Ga_{0.82}N$ layer 133 (carrier concentration: $3 \times 10^{17}$ $cm^{-3}$) doped with Mg; and a 50 nm-thick p-type GaN layer 134 (carrier concentration: $1 \times 10^{18}$ $cm^{-3}$) doped with Mg.

Subsequently, as a p-side electrode 141, a Ni/Au electrode of 0.2 mm×0.2 mm×0.5 μm in thickness was formed by vacuum evaporation technique in the two directions orthogonal to each other on the p-type GaN layer 134 at a pitch of 1 mm. Likewise, onto a second major face of the GaN substrates (III nitride crystal substrates 100), as an n-side electrode 142, a 1 μm-thick Ti/Al electrode was formed by (vacuum) evaporation.

Next, wafers in which an at least single-lamina III nitride layer 130 was formed onto a GaN substrates were divided into a plurality of chips of 1 mm×1 mm—that is, into light-emitting devices—so that each p-side electrode came to the central part of each of the chips. The light-emitting devices manufactured in this manner were blue-violet light-emitting diodes (LEDs) having emission peak wavelength of 405 nm.

For corresponding light-emitting devices for each group, fabricated employing GaN substrates of each group, emission intensities integrated over an emission wavelength range of from 385 nm to 425 nm were measured. The measurements of total dislocation density and emission intensity for the plurality of light-emitting devices are entered in the table, while the relationship between the total dislocation density and emission intensity for the plurality of light-emitting devices is graphed in FIG. 6. Herein, "—" in the table indicates "unmeasured." Furthermore, in FIG. 6: the line R represents the relationship between total dislocation density and emission intensity for light-emitting devices in which an at least single-lamina nitride semiconductor layer was formed onto a Group-R III nitride crystal substrate (termed Group R light-emitting devices); the line A represents the relationship between total dislocation density and emission intensity in light-emitting devices in which an at least single-lamina nitride semiconductor layer was formed onto a Group-A III nitride crystal substrate (termed Group A light-emitting devices); and the line B represents the relationship between total dislocation density and emission intensity in light-emitting devices in which an at least single-lamina nitride semiconductor layer was formed onto a Group-B III nitride crystal substrate (termed Group B light-emitting devices).

TABLE

| Group R | | Group A | | Group B | |
| --- | --- | --- | --- | --- | --- |
| Total dislocation density ($cm^{-3}$) | Integrated emission intensity (arbitrary units) | Total dislocation density ($cm^{-3}$) | Integrated emission intensity (arbitrary units) | Total dislocation density ($cm^{-3}$) | Emission intensity integral (arbitrary units) |
| $5.0 \times 10^1$ | 0.85 | $4.0 \times 10^1$ | 0.86 | $6.5 \times 10^1$ | 0.87 |
| $1.0 \times 10^2$ | 0.91 | $1.0 \times 10^2$ | 0.896 | $3.7 \times 10^2$ | 0.95 |
| $2.4 \times 10^2$ | 0.97 | $6.0 \times 10^2$ | 0.99 | $6.5 \times 10^2$ | 0.98 |
| $1.0 \times 10^3$ | 1.00 | $1.2 \times 10^3$ | 1.02 | $2.1 \times 10^3$ | 1.00 |
| $3.0 \times 10^3$ | 1.02 | $4.0 \times 10^3$ | 1.00 | $2.9 \times 10^3$ | 1.02 |
| $7.0 \times 10^3$ | 0.99 | $9.0 \times 10^3$ | 1.01 | $6.2 \times 10^3$ | 0.99 |
| $1.2 \times 10^4$ | 1.01 | $1.5 \times 10^4$ | 1.03 | $9.8 \times 10^3$ | 1.03 |
| $2.7 \times 10^4$ | 1.00 | $4.2 \times 10^4$ | 1.01 | $2.7 \times 10^4$ | 0.99 |

TABLE-continued

| Group R | | Group A | | Group B | |
|---|---|---|---|---|---|
| Total dislocation density ($cm^{-3}$) | Integrated emission intensity (arbitrary units) | Total dislocation density ($cm^{-3}$) | Integrated emission intensity (arbitrary units) | Total dislocation density ($cm^{-3}$) | Emission intensity integral (arbitrary units) |
| $5.8 \times 10^4$ | 1.01 | $7.0 \times 10^4$ | 0.99 | $4.8 \times 10^4$ | 1.02 |
| $7.6 \times 10^4$ | 0.99 | $1.1 \times 10^5$ | 1.00 | $6.6 \times 10^4$ | 1.02 |
| $1.0 \times 10^5$ | 0.98 | $3.8 \times 10^5$ | 1.01 | $2.0 \times 10^5$ | 1.03 |
| $4.0 \times 10^5$ | 0.96 | $5.0 \times 10^5$ | 0.99 | $3.7 \times 10^5$ | 1.01 |
| $7.0 \times 10^5$ | 0.94 | $1.1 \times 10^6$ | 0.96 | $7.1 \times 10^5$ | 1.02 |
| $1.0 \times 10^6$ | 0.92 | $3.1 \times 10^6$ | 0.92 | $2.5 \times 10^6$ | 0.97 |
| $3.0 \times 10^6$ | 0.89 | $4.5 \times 10^6$ | 0.88 | $3.0 \times 10^6$ | 0.98 |
| $5.0 \times 10^6$ | 0.86 | — | — | $6.1 \times 10^6$ | 0.88 |

As is apparent from the table and FIG. 6, with total dislocation density being in the range from $1 \times 10^4$ $cm^{-2}$ to $3 \times 10^6$ $cm^{-2}$, light-emitting devices (devices in the Group A) with a plurality of III nitride layers deposited onto a III nitride crystal substrate in which the ratio of screw-dislocation density to the total dislocation density is 0.5 or greater have higher emission intensities by comparison with light-emitting devices (devices in Group R) with a plurality of III nitride layers deposited onto a III nitride crystal substrate in which ratio of screw-dislocation density to the total dislocation density is less than 0.5.

Furthermore, with total dislocation density being in the range from $1 \times 10^4$ $cm^{-2}$ to $3 \times 10^6$ $cm^{-2}$, light-emitting devices (devices in Group B) with a plurality of III nitride layers deposited onto a III nitride crystal substrate in which ratio of screw-dislocation density to the total dislocation density is 0.9 or more have still higher emission intensities by comparison with the light-emitting devices (devices in Group A) with a plurality of III nitride layers deposited onto a III nitride crystal substrate in which ratio of screw-dislocation density to the total dislocation density is 0.5 or greater.

The presently disclosed embodiment modes and embodiments should in all respects be considered to be illustrative and not limiting. The scope of the present invention is set forth not by the foregoing description but by the scope of the patent claims, and is intended to include meanings equivalent to the scope of the patent claims and all modifications within the scope.

What is claimed is:

1. A III-nitride crystal substrate manufacturing method, comprising:
   a step of preparing a starting undersubstrate including a III nitride crystal layer having a major face, with the major face having a predetermined angle of inclination of from 0.5° to 10° with respect to a {0001} plane of the III nitride crystal layer;
   a step of forming on the major face of the starting undersubstrate a plurality of micro-steps consisting of a plurality of terraced faces paralleling the {0001} plane, and of a plurality of stepped planes having a predetermined angle with respect to the {0001} plane;
   a step of initially growing III nitride crystal to a predetermined thickness by a liquid-phase technique onto the major face of the starting undersubstrate;
   a step of additionally growing III nitride crystal onto the liquid-phase grown III-nitride crystal; and
   a step of slicing the additionally grown III-nitride crystal through a plane paralleling the {0001} plane to produce a III-nitride crystal substrate; wherein
   said inclination of, and the form of said micro-steps on, the starting undersubstrate major face are predetermined such that in a major-face principal region of the III-nitride crystal substrate excluding the peripheral margin from the outer periphery of the major face to a 5 mm separation from the outer periphery, the substrate has a total density of screw dislocations, edge dislocations, and mixed screw-and-edge dislocations of between $1 \times 10^4$ $cm^{-2}$ and $5 \times 10^5$ $cm^{-2}$ inclusive, and has a ratio of screw-dislocation density to said total dislocation density of not less than 0.5.

2. A III-nitride crystal substrate manufacturing method, comprising:
   a step of preparing a starting undersubstrate including a III nitride crystal layer having a major face, with the major face having a predetermined angle of inclination of from 0.5° to 10° with respect to a {0001} plane of the III nitride crystal layer;
   a step of forming on the major face of the starting undersubstrate a plurality of micro-steps consisting of a plurality of terraced faces paralleling the {0001} plane, and of a plurality of stepped planes having a predetermined angle with respect to the {0001} plane; and
   a step of initially growing III nitride crystal to a predetermined thickness by a liquid-phase technique onto the major face of the starting undersubstrate;
   a step of additionally growing III nitride crystal onto the liquid-phase grown III-nitride crystal; and
   a step of slicing the additionally grown III-nitride crystal through a plane paralleling the {0001} plane to produce a III-nitride crystal substrate; wherein
   said inclination of, and the form of said micro-steps on, the starting undersubstrate major face are predetermined such that in a major-face principal region of the III-nitride crystal substrate excluding the peripheral margin from the outer periphery of the major face to a 5 mm separation from the outer periphery, the substrate has a total density of screw dislocations, edge dislocations, and mixed screw-and-edge dislocations of between $1 \times 10^4$ $cm^{-2}$ and $5 \times 10^5$ $cm^{-2}$ inclusive, and has a ratio of screw-dislocation density to said total dislocation density of not less than 0.9.

3. A light-emitting device manufacturing method, comprising:
   the III-nitride crystal substrate manufacturing method of claim 1; and
   a step of forming an at least single-lamina III nitride layer onto the III nitride crystal substrate.

4. A light-emitting device manufacturing method, comprising:
   the III-nitride crystal substrate manufacturing method of claim 2; and
   a step of forming an at least single-lamina III nitride layer onto the III nitride crystal substrate.

5. The III-nitride crystal substrate manufacturing method as set forth in claim 1, further comprising a step in between said steps of initially and additionally growing III-nitride crystal, of planarizing the liquid-phase grown III-nitride crystal to form thereon a major face paralleling the {0001} plane of the III nitride crystal layer on the starting undersubstrate; wherein
   in said step of additionally growing III nitride crystal, the growth is by a vapor-phase technique.

6. The III-nitride crystal substrate manufacturing method as set forth in claim 2, further comprising a step in between said steps of initially and additionally growing III-nitride crystal, of planarizing the liquid-phase grown III-nitride crystal to form thereon a major face paralleling the {0001} plane of the III nitride crystal layer on the starting undersubstrate; wherein
    in said step of additionally growing III nitride crystal, the growth is by a vapor-phase technique.

* * * * *